(12) United States Patent
Shin

(10) Patent No.: US 8,044,833 B2
(45) Date of Patent: Oct. 25, 2011

(54) HIGH SPEED SERIALIZER

(75) Inventor: Jeong-Gyun Shin, Buellton, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/687,504

(22) Filed: Jan. 14, 2010

(65) Prior Publication Data

US 2010/0183108 A1    Jul. 22, 2010

Related U.S. Application Data

(60) Provisional application No. 61/145,462, filed on Jan. 16, 2009.

(51) Int. Cl.
*H03M 9/00* (2006.01)
(52) U.S. Cl. .......................... 341/101; 341/100
(58) Field of Classification Search .............. 341/101, 341/100
See application file for complete search history.

(56) References Cited

U.S. PATENT DOCUMENTS

| | | | |
|---|---|---|---|
| 5,726,990 A * | 3/1998 | Shimada et al. | 370/536 |
| 7,006,021 B1 * | 2/2006 | Lombaard | 341/100 |
| 7,079,055 B2 | 7/2006 | Padaparambil | |
| 7,864,084 B2 * | 1/2011 | Padaparambil | 341/101 |
| 2002/0075173 A1 | 6/2002 | Nagata | |
| 2004/0042503 A1 | 3/2004 | Shaeffer et al. | |

FOREIGN PATENT DOCUMENTS

FR    2 729 528    7/1996

OTHER PUBLICATIONS

Notification of Transmittal of the International Search Report and the Written Opinion of the International Searching Authority, or the Declaration; PCT/US2010/021135; 21 pages; dated Apr. 1, 2010.

* cited by examiner

*Primary Examiner* — Brian Young
(74) *Attorney, Agent, or Firm* — Baker Botts L.L.P.

(57) ABSTRACT

According to one embodiment, a high speed serializer for multiplexing $2^N$ data inputs, N being a positive integer, comprises one less than $2^N$ multiplexing cells arranged in N stages. The stages are numbered 1 through N, and the output of the $N^{th}$ stage is a serial transmission and the inputs of the $1^{st}$ stage are the $2^N$ data inputs. Each stage comprises half as many multiplexing cells as the preceding stage. Additionally, each multiplexing cell comprises a multiplexer that comprises a pair of inputs and an output. $2^{N-2}$ of the multiplexing cells in the first stage further comprise a latch, and the output of the latch is coupled to an input of the multiplexer.

34 Claims, 5 Drawing Sheets

8,044,833 B2

HIGH SPEED SERIALIZER

CROSS REFERENCE TO RELATED APPLICATIONS

This application claims the benefit of U.S. Provisional Application No. 61/145,462 entitled HIGH SPEED SERIALIZER, by Jeong-Gyun Shin, filed Jan. 16, 2009, and is hereby incorporated by reference herein.

TECHNICAL FIELD OF THE DISCLOSURE

This disclosure generally relates to electronic circuitry, and more particularly, to a high speed serializer.

BACKGROUND OF THE DISCLOSURE

Serializers are used to convert a parallel datastream into a serial bitstream so that it can be stored on a storage medium or transmitted across a network communication link. Serializers may be used in a variety of contexts. For example, serializers may be used within a readout integrated circuit (ROIC). An ROIC is an electrical circuit multiplexer that mechanically and electrically interfaces to a focal plane array sensor to transmit the sensor data to external electronics in order to construct an image.

SUMMARY OF THE DISCLOSURE

According to one embodiment, a high speed serializer for multiplexing $2^N$ data inputs, N being a positive integer, comprises one less than $2^N$ multiplexing cells arranged in N stages. The stages are numbered 1 through N, and the output of the $N^{th}$ stage is a serial transmission and the inputs of the $1^{st}$ stage are the $2^N$ data inputs. Each stage comprises half as many multiplexing cells as the preceding stage. Additionally, each multiplexing cell comprises a multiplexer that comprises a pair of inputs and an output. $2^{N-2}$ of the multiplexing cells in the first stage further comprise a latch, and the output of the latch is coupled to an input of the multiplexer.

According to another embodiment, a high speed serializer for multiplexing $2^N$ data inputs, N being a positive integer, comprises a plurality of multiplexing cells arranged in N stages. The stages are numbered 1 through N, and the output of the $N^{th}$ stage is a serial transmission and the inputs of the $1^{st}$ stage are the $2^N$ data inputs. Each multiplexing cell comprises at least a multiplexer that comprises a pair of inputs and an output. The multiplexer in the $N^{th}$ stage is configured for receiving a clock signal and the multiplexers in each stage preceding the $N^{th}$ stage are configured for receiving one of two clock signals. Half of the multiplexers in each stage preceding the $N^{th}$ stage are configured for receiving the same one of two clock signals, and the clock signals received by the multiplexers in each stage preceding the $N^{th}$ stage operate at half the frequency of the clock signals received by the multiplexers cells in the subsequent stage. Additionally, the two clock signals received by the multiplexers in each stage preceding the $N^{th}$ stage are skewed from each other by a half cycle of the clock signal of the subsequent stage.

A potential technical advantage of some embodiments of the invention is low power consumption of the serializer due to its using a minimal number of latches. Another potential technical advantage of some embodiments of the invention is low power consumption of the serializer due to its use of a slower clock signal frequency generated on both edges of a fast clock signal.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

Serializers often consume large amounts of power due to their using a high number of circuit elements operating at a high clock frequency. As it is desirable for serializers to have low power consumption, it is preferable for serializers to use a minimal number of circuit elements. Additionally, it is desirable for the circuit elements of the serializer to operate at a low clock frequency.

Figure 1:
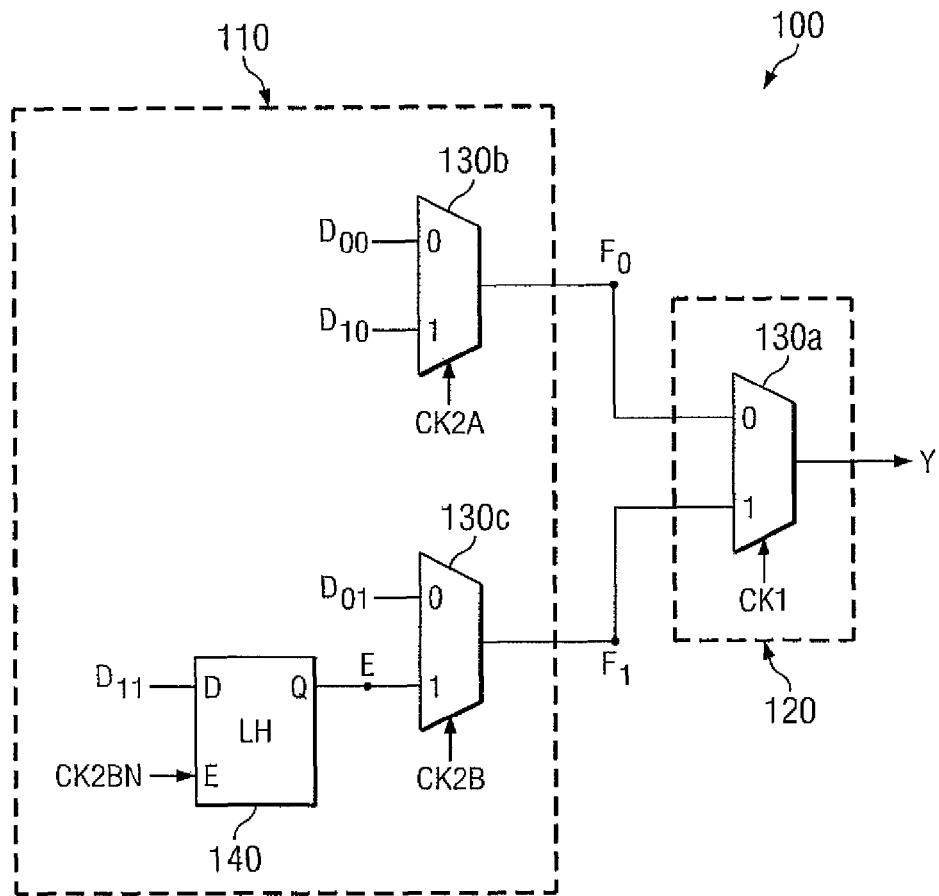
FIG. 1 illustrates one embodiment of a serializer for multiplexing four inputs.

FIG. 1 illustrates one embodiment of a serializer 100 for multiplexing four inputs $D_{00}$, $D_{01}$, $D_{10}$, and $D_{11}$. The serializer has two stages, 110 and 120. Each stage comprises a number of multiplexing cells, which can either consist of a sole multiplexer 130a or 130b or a multiplexer 130c coupled to a latch 140. Stage 120 has one-half the number of multiplexing cells of the preceding stage 110, and serializer 100 comprises a total of three multiplexing cells. Generally, each of the four inputs $D_{00}$, $D_{01}$, $D_{10}$, and $D_{11}$ passes, in succession, through one of the multiplexing cells in stage 110 prior to passing through the multiplexer 130a of stage 120 to the output Y.

Each of the circuit elements 130a, 130b, 130c, and 140 operates according to a different clock signal. Each clock signal has a high state and a low state between which it transitions. Each transition of the clock signal is termed an edge. The multiplexer 130a of stage 120 operates according to a clock signal CK1 that transitions at twice the frequency of the clock signals CK2A, CK2B, and CK2BN, according to which the circuit elements 130b, 130c, and 140 of stage 110 operate. Clock signals CK2A and CK2B are skewed from each other by one half of the cycle of CK1, with the falling edge of CK2B following the falling edge of CK2A. The clock signal CK2BN has the opposite state of clock signal CK2B.

Latch 140 is an active positive level latch operating with an input $D_{11}$ and according to a clock signal CK2BN. As an active positive level latch, its output Q is equal to its input $D_{11}$ when the clock signal CK2BN is high. When the clock CK2BN is low, the input $D_{11}$ has no effect on the output. The output of latch 140 is routed to the input of multiplexer 130c by way of node E.

Multiplexer 130c, operating according to clock signal CK2B, has two inputs from which it selects to output to multiplexer 130a by way of node $F_1$. When CK2B is low, multiplexer 130c selects input $D_{01}$, and when CK2B is high, multiplexer 130c selects the value at node E.

Multiplexer 130b, operating according to clock signal CK2A, has two inputs $D_{00}$ and $D_{10}$ from which it selects to output to multiplexer 130a by way of. node $F_0$. When CK2A is low, multiplexer 130c selects input $D_{00}$, and when CK2B is high, multiplexer 130c selects input $D_{10}$.

The outputs of multiplexers 130b and 130c are routed to the inputs of multiplexer 130a by way of nodes $F_0$ and $F_1$, respectively. Multiplexer 130a, operating according to clock signal CK1, selects the value at node $F_0$ when CK1 is low and the value at node $F_1$ when CK1 is high. The value selected by multiplexer 130a is routed to output Y for serial transmission.

One potential technical advantage of serializer 100 is its use of only one latch 140 to transmit four inputs. The usage of a minimal number of latches may result in low power consumption of the serializer.

Figure 2:
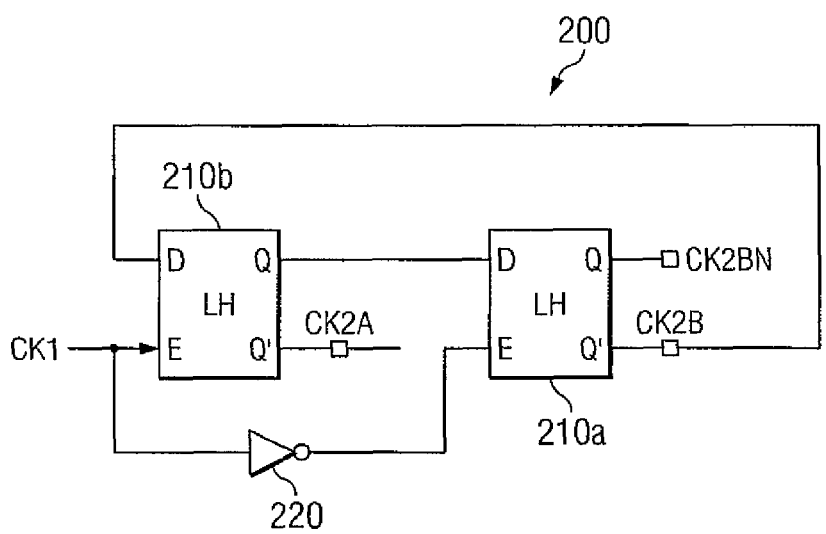
FIG. 2 illustrates one embodiment of a clock generator for a serializer for multiplexing four inputs.

FIG. 2 illustrates one embodiment of a clock generator for the clock signals used in a serializer for multiplexing four inputs. Generally, clock generator 200 comprises two gated D-latches 210a and 210b configured to function as a master-slave flip-flop. Clock signal CK1 is passed through the master-slave flip-flop in order to generate clock signals CK2A, CK2B, and CK2BN from tapping appropriate outputs of the master-slave flip-flop. In this manner, the clock signal according to which circuit elements of a particular stage operate is used to generate the clock signals according to which the circuit elements of the preceding stage operate.

Latch 210a is an active positive level latch, the input of which is the output of latch 210b. Latch 210a operates according to the clock signal resulting from passing clock signal CK1 through an inverter 220. As an active positive level latch, its output Q is equal to its input when its clock signal is high. When its clock signal is low, the input has no effect on the output. The output of latch 210a is used as clock signal CK2BN, according to which latch 140 of serializer 100 operates, The inverse of the output of latch 210a is routed to the input of latch 210b. Additionally, the inverse of the output of latch 210a is used as clock signal CK2B, according to which multiplexer 130c of serializer 100 operates.

Latch 210b is an active positive level latch, the input of which is the inverse of the output of latch 210a. Latch 210b operates according to clock signal CK1. As an active positive level latch, its output Q is equal to its input when its clock signal is high. When its clock signal is low, the input has no effect on the output. The output of latch 210b is used as the input of latch 210a. The inverse of the output of latch 210b is used as clock signal CK2A, according to which multiplexer 130b of serializer 100 operates.

By generating clock signals CK2A, CK2B, and CK2BN by passing clock signal CK1 through a master-slave flip-flop, a 4-input serializer may transmit data on both clock phases of CK1. This transmission is accomplished by generating slower clock signals CK2A, CK2B, and CK2BN on both edges of the faster clock signal CK1. Each time CK1 transitions from one state to another, the output of at least one of the latches 210 changes. Thus, each time CK1 transitions from one state to another, at least one of the outputs of the clock signals CK2A, CK2B, and CK2BN changes.

Figure 3:
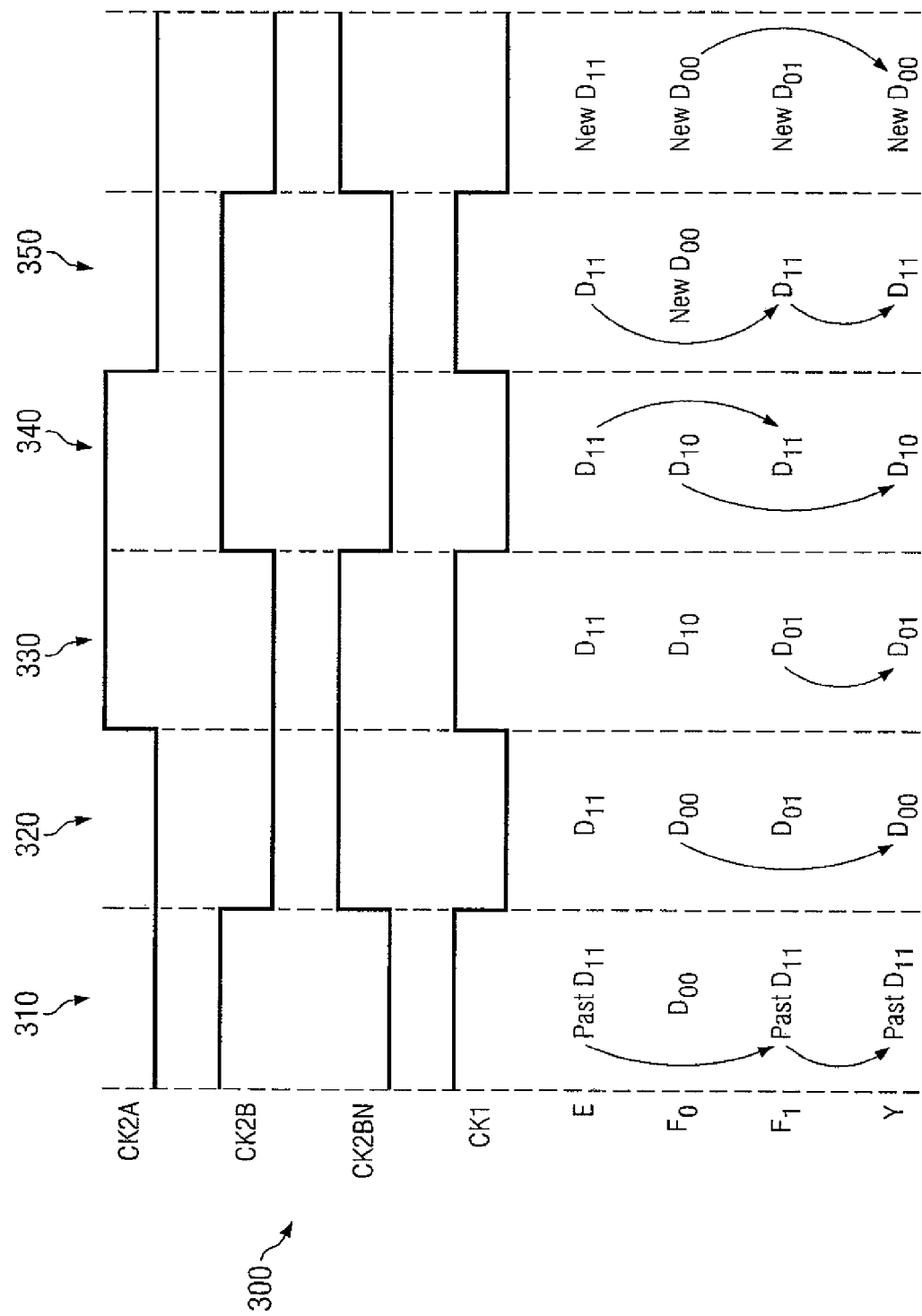
FIG. 3 is a data-flow diagram of a serializer for multiplexing four inputs, in accordance with the embodiment illustrated in FIG. 1.

FIG. 3 is a data-flow diagram of serializer 100 for multiplexing four inputs. The clock signals CK2A, CK2B, and CK2BN operate as described in reference to FIG. 1. In this example, the data inputs $D_{00}$, $D_{01}$, $D_{10}$, and $D_{11}$ are made available at the falling edge of clock signal CK2A. During time slot 310, clock signals CK2A and CK2BN are low, and clock signals CK1 and CK2B are high. As CK2A is low, multiplexer 130b selects input $D_{00}$ to output to node $F_0$. As CK2BN is low as well, the input $D_{11}$ has no effect on the output of the latch 140, and node E remains equal to the value of the past $D_{11}$. As CK2B is high, multiplexer 130c selects the past $D_{11}$ to output to node $F_1$, and, as CK1 is high, multiplexer 130a selects the past $D_{11}$ to route to output Y.

Time slot 310 is equal to or larger than the sum of the clock-to-Q delay that generates input data bit $D_{00}$ and the time it takes for $D_{00}$ to propagate through multiplexer 130b. Thus, by the completion of time slot 310, $F_0$ is equal to the value of $D_{00}$. The path for $D_{00}$ is the time critical path of the serializer. As such, the path for $D_{00}$ affects how quickly serializer 100 can transmit the four data inputs.

During time slot 320, clock signals CK2A, CK2B, and CK1 are low, while clock signal CK2BN is high. CK1 is low, and as CK2A has remained low as well, multiplexer 130a selects $D_{00}$ to route from node $F_0$ to output Y. As CK2BN is high, the output of latch 140 is equal to its input $D_{11}$, and node E is set to the value of $D_{11}$. As CK2B is low, multiplexer 130c selects input $D_{01}$ to output to node $F_1$.

During time slot 330, clock signals CK1, CK2A, and CK2BN are high, while clock signal CK2B is low. As clock signal CK1 is high, and as CK2B has remained low, multiplexer 130a selects input $D_{01}$ to route from node $F_1$ to output Y. As clock signal CK2A is high, multiplexer 130b selects input $D_{10}$ to output to node $F_0$. As clock signal CK2BN has remained high, node E remains set to the value of $D_{11}$.

During time slot 340, clock signals CK2A and CK2B are high, while clock signals CK1 and CK2BN are low. As CK1 is low, and as CK2A has remained high, multiplexer 130a selects input $D_{10}$ to route from node $F_0$ to output Y. As CK2BN is low, the input of latch 140 has no effect on its output, and node E remains equal to $D_{11}$. As CK2B is high, multiplexer 130c selects past $D_{11}$ at node E to output to node $F_1$.

During time slot 350, clock signals CK1 and CK2B are high, while clock signals CK2BN and CK2A are low. Additionally, new data inputs are made available to multiplexer 130a, multiplexer 130b, and latch 140. As CK2BN is low, the new data input to latch 140 has no effect on the output of the latch. As CK1 is high, and as CK2B has remained high as well, multiplexer 130a selects $D_{11}$ from node $F_1$ to route to output Y. As CK2A is low, multiplexer 130b selects the new $D_{00}$ to output to node $F_0$.

The latch 140's holding of the last digit to be transmitted allows for the inputting of new data to the serializer without affecting the transmission of the last digit of the sequence. The output of the latch is routed through the multiplexers 130c and 130a when clock signals CK2B and CK1 are high. Since the latch operates according to the inverse of clock signal CK2B, the latch will not allow the data input to pass through the latch during the time slot in which the past $D_{11}$ is routed to output Y. As $D_{11}$ is routed to Y when CK2B and CK1 are high, CK2BN will be low during that time, and the output of the latch 140 will not be affected by its input.

As FIG. 3 illustrates, a serializer 100 can process data inputs $D_{00}$, $D_{01}$, $D_{10}$, and $D_{11}$ using only one latch. The serializer 100 processes the data inputs using three clock signals—CK2A, CK2B, and CK2BN—generated on both edges of clock signal CK1. By taking advantage of slower clock signal generation on both edges of clock signal CK1 and using only one latch, serializer 100 may consumer less power than other serializers.

Figure 4:
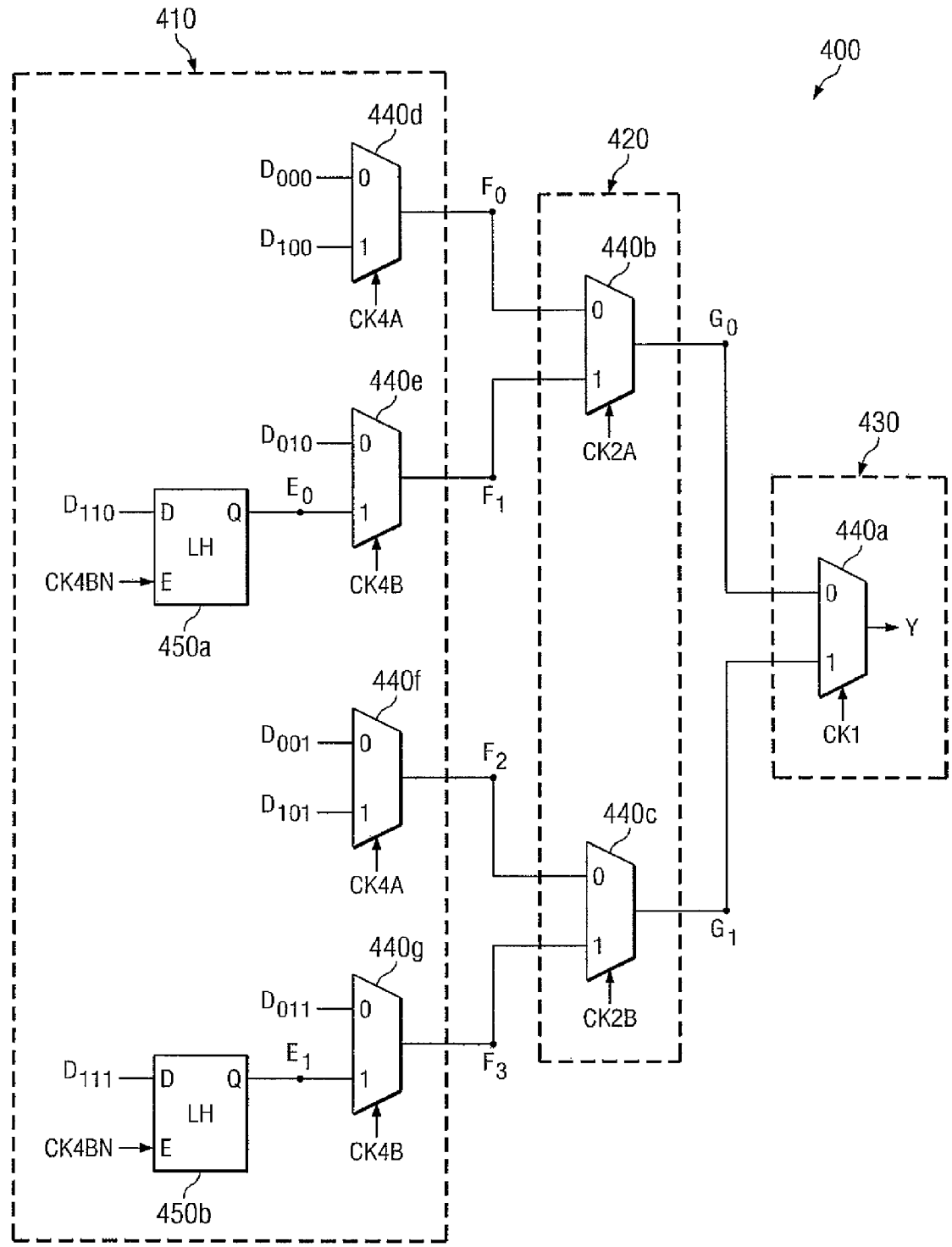
FIG. 4 illustrates one embodiment of a serializer for multiplexing eight inputs.

FIG. 4 illustrates one embodiment of a serializer 400 for multiplexing eight inputs $D_{000}$, $D_{001}$, $D_{010}$, $D_{011}$, $D_{100}$, $D_{101}$, $D_{110}$, and $D_{111}$. The serializer has three stages, 410, 420, and 430. Each stage comprises a number of multiplexing cells, which can either consist of a sole multiplexer 440a, 440b, 440c, 440d, or 440f, or a multiplexing cell can consist of a multiplexer 440e or 440g coupled to a latch 450a or 450b.

Stage 420 has one-half the number of multiplexing cells of the preceding stage 410, stage 430 has one-half the number of multiplexing cells as the preceding stage 420, and serializer 400 comprises a total of seven multiplexing cells. Generally, each of the 8 inputs $D_{000}$, $D_{001}$, $D_{010}$, $D_{011}$, $D_{100}$, $D_{101}$, $D_{110}$, and $D_{111}$ passes, in succession, through one of the multiplexing cells in stage 410 prior to passing through one of the multiplexing cells in stage 420. After passing through one of the multiplexing cells in stage 420, each of the 8 inputs passes through the multiplexer 440a of stage 430 to the output Y.

The circuit elements of serializer 400 operate according to seven different clock signals. Each clock signal has a high state and a low state between which it transitions. Each transition of the clock signal is termed an edge. The multiplexer 440a of stage 430 operates according to a clock signal CK1 that transitions at twice the frequency of the clock signals CK2A and CK2B, according to which the multiplexers 440b and 440c of stage 420 operate. Clock signals CK2A and CK2B are skewed from each other by one half of the cycle of CK1, with the falling edge of CK2B following the falling edge of CK2A. Clock signals CK2A and CK2B transition at twice the frequency of clock signals CK4A and CK4B, according to which multiplexers 440d, 440e, 440f, and 440g of stage 410 operate. Clock signals CK4A and CK4B are skewed from each other by one half of the cycle of CK2A, with the falling edge of CK4B following the falling edge of CK4A. The clock signal CK4BN, according to which latches 450a and 450b operate, has the opposite state of clock signal CK4B.

Latches 450a and 450b are active positive level latches operating according to a clock signal CK4BN. Latch 450a uses $D_{110}$ as its input, and as an active positive level latch, its output Q is equal to its input $D_{110}$ when the clock signal CK4BN is high. When the clock CK4BN is low, the input $D_{110}$ has no effect on the output. The output of latch 450a is routed to the input of multiplexer 440e by way of node $E_0$. Latch 450b uses $D_{111}$ as its input, and as an active positive level latch, its output Q is equal to its input $D_{111}$ when the clock signal CK4BN is high. When the clock CK4BN is low, the input $D_{111}$ has no effect on the output. The output of latch 450b is routed to the input of multiplexer 440g by way of node $E_1$.

Multiplexer 440e, operating according to clock signal CK4B, has two inputs from which it selects to output to multiplexer 440b by way of node $F_1$. When CK4B is low, multiplexer 440e selects input $D_{010}$, and when CK4B is high, multiplexer 440e selects the value at node $E_0$.

Multiplexer 440d, operating according to clock signal CK4A, has two inputs from which it selects to output to multiplexer 440b by way of node $F_0$. When CK4A is low, multiplexer 440d selects input $D_{000}$, and when CK4A is high, multiplexer 440d selects $D_{100}$.

Multiplexer 440g, operating according to clock signal CK4B, has two inputs from which it selects to output to multiplexer 440c by way of node $F_3$. When CK4B is low, multiplexer 440g selects input $D_{011}$, and when CK4B is high, multiplexer 440g selects the value at node $E_1$.

Multiplexer 440f, operating according to clock signal CK4A, has two inputs from which it selects to output to multiplexer 440c by way of node $F_2$. When CK4A is low, multiplexer 440f selects input $D_{001}$, and when CK4A is high, multiplexer 440f selects $D_{101}$.

The outputs of multiplexers 440d and 440e are routed to the inputs of multiplexer 440b by way of nodes $F_0$ and $F_1$, respectively. Multiplexer 440b, operating according to clock signal CK2A, selects the value at node $F_0$ when CK2A is low and the value at node $F_1$ when CK2A is high. The value selected by multiplexer 440b is routed to multiplexer 440a by way of node $G_0$.

The outputs of multiplexers 440f and 440g are routed to the inputs of multiplexer 440c by way of nodes $F_2$ and $F_3$, respectively. Multiplexer 440c, operating according to clock signal CK2B, selects the value at node $F_2$ when CK2B is low and the value at node $F_3$ when CK2B is high. The value selected by multiplexer 440c is routed to multiplexer 440a by way of node $G_1$.

The outputs of multiplexers 440b and 440c are routed to the inputs of multiplexer 440a by way of nodes $G_0$ and $G_1$, respectively. Multiplexer 440a, operating according to clock signal CK1, selects the value at $G_0$ when CK1 is low and the value at $G_1$ when CK1 is high. The value selected by multiplexer 440a is routed to output Y for serial transmission.

One potential technical advantage of serializer 400 is its use of only two latches 450 to transmit eight inputs. The usage of a minimal number of latches may result in low power consumption of the serializer.

Figure 5:
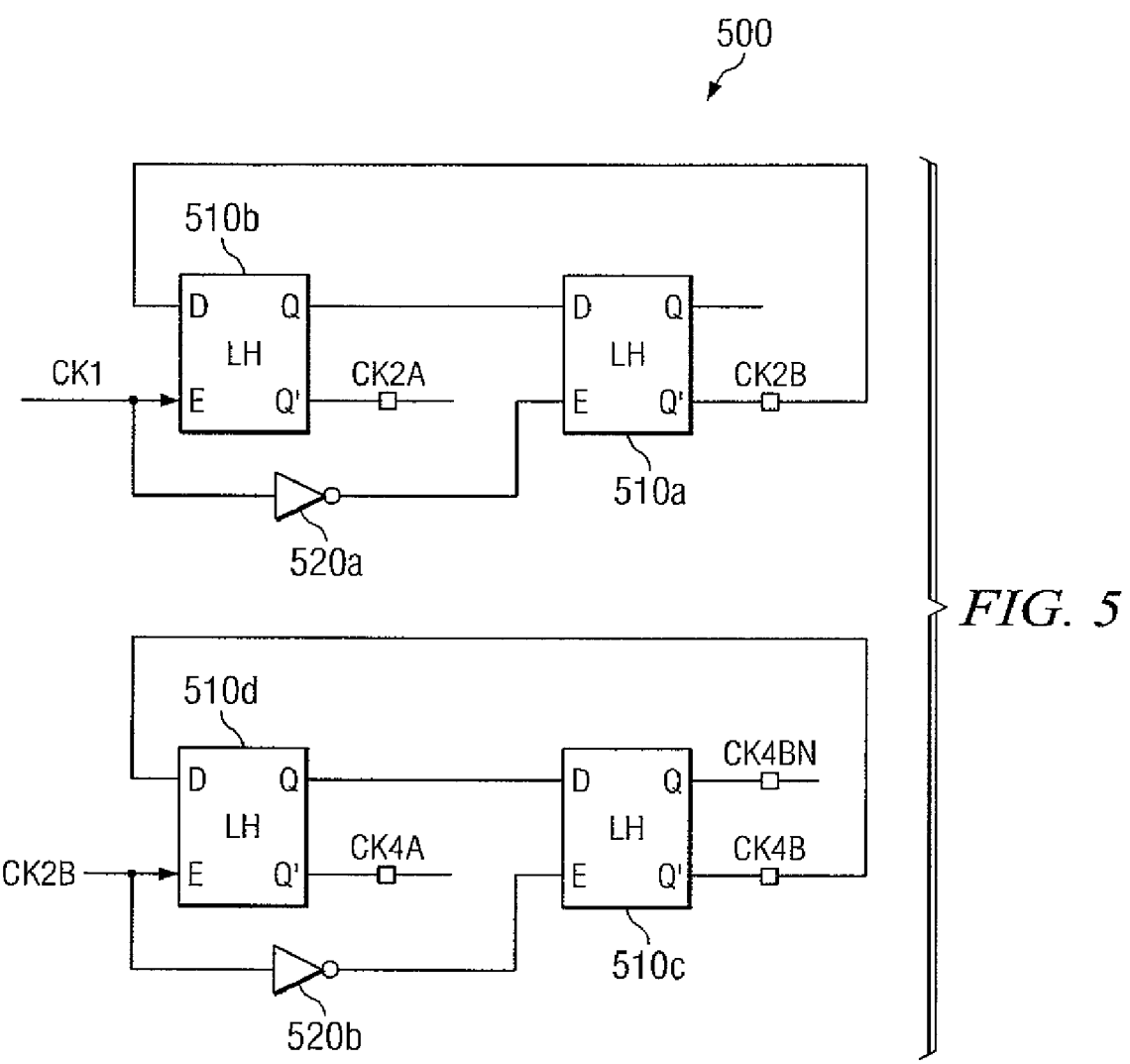
FIG. 5 illustrates one embodiment of a clock generator for a serializer for multiplexing eight inputs.

FIG. 5 illustrates one embodiment of a clock generator for the clock signals used in a serializer for multiplexing eight inputs. Generally, clock generator 500 comprises two gated D-latches 510a and 510b configured to function as a master-slave flip-flop. Clock signal CK1 is passed through the master-slave flip-flop in order to generate clock signals CK2A, and CK2B from tapping appropriate outputs of the master-slave flip-flop. Clock generator 500 also comprises two gated D-latches 510c and 510d configured to function as a master-slave flip-flop. Clock signal CK2B is passed through the master-slave flip-flop in order to generate clock signals CK4A, CK4B, and CK4BN from tapping appropriate outputs of the master-slave flip-flop.

Latch 510a is an active positive level latch, the input of which is the output of latch Slob. Latch 510a operates according to the clock signal resulting from passing clock signal CK1 through an inverter 520a. As an active positive level latch, its output Q is equal to its input when its clock signal is high. When its clock signal is low, the input has no effect on the output. The inverse of the output of latch 510a is routed to the input of latch 510b. Additionally, the inverse of the output of latch 510a is used as clock signal CK2B, according to which multiplexer 440c of serializer 400 operates. CK2B also serves as the clock signal of the master-slave flip-flop that generates clock signals CK4A, CK4B, and CK4BN.

Latch 510b is an active positive level latch, the input of which is the inverse of the output of latch 510a. Latch 510b operates according to clock signal CK1. As an active positive level latch, its output Q is equal to its input when its clock signal is high. When its clock signal is low, the input has no effect on the output. The output of latch 510b is used as the input of latch 510a. The inverse of the output of latch 510b is used as clock signal CK2A, according to which multiplexer 440b of serializer 400 operates.

Latch 510c is an active positive level latch, the input of which is the output of latch 510d. Latch 510c operates according to the clock signal resulting from passing clock signal CK2B through an inverter 520b. As an active positive level latch, its output Q is equal to its input when its clock signal is high. When its clock signal is low, the input has no effect on the output. The output of latch 510c is used as clock signal CK4BN, according to which latches 450a and 450b of serializer 400 operates. The inverse of the output of latch 510c is routed to the input of latch 510d. Additionally, the inverse of the output of latch 510c is used as clock signal CK4B, according to which multiplexers 440e and 440g of serializer 400 operates.

Latch 510d is an active positive level latch, the input of which is the inverse of the output of latch 510c. Latch 510d operates according to clock signal CK2B. As an active positive level latch, its output Q is equal to its input when its clock signal is high. When its clock signal is low, the input has no effect on the output. The output of latch 510d is used as the input of latch 510c. The inverse of the output of latch 510d is used as clock signal CK4A, according to which multiplexers 440d and 440f of serializer 400 operate.

By generating clock signals CK2A, CK2B, CK4A, CK4B, and CK4BN by passing clock signals CK1 and CK2 through master-slave flip-flops, an 8-input serializer may transmit data on both clock phases of CK1. This transmission is accomplished by generating slower clock signals CK2A, CK2B, CK4A, CK4B, and CK4BN on both edges of the faster clock signal CK1. Each time CK1 transitions from one state to another, the output of at least one of the latches 510a and 510b changes. Thus, each time CK1 transitions from one state to another, at least one of the outputs of the clock signals CK2A and CK2B changes. Additionally, each time CK2B transitions from one state to another, the output of at least one of the latches 510c and 510d changes. Thus, each time CK2B transitions from one state to another, at least one of the outputs of the clock signals CK4A, CK4B, and CK4BN changes.

Figure 6:
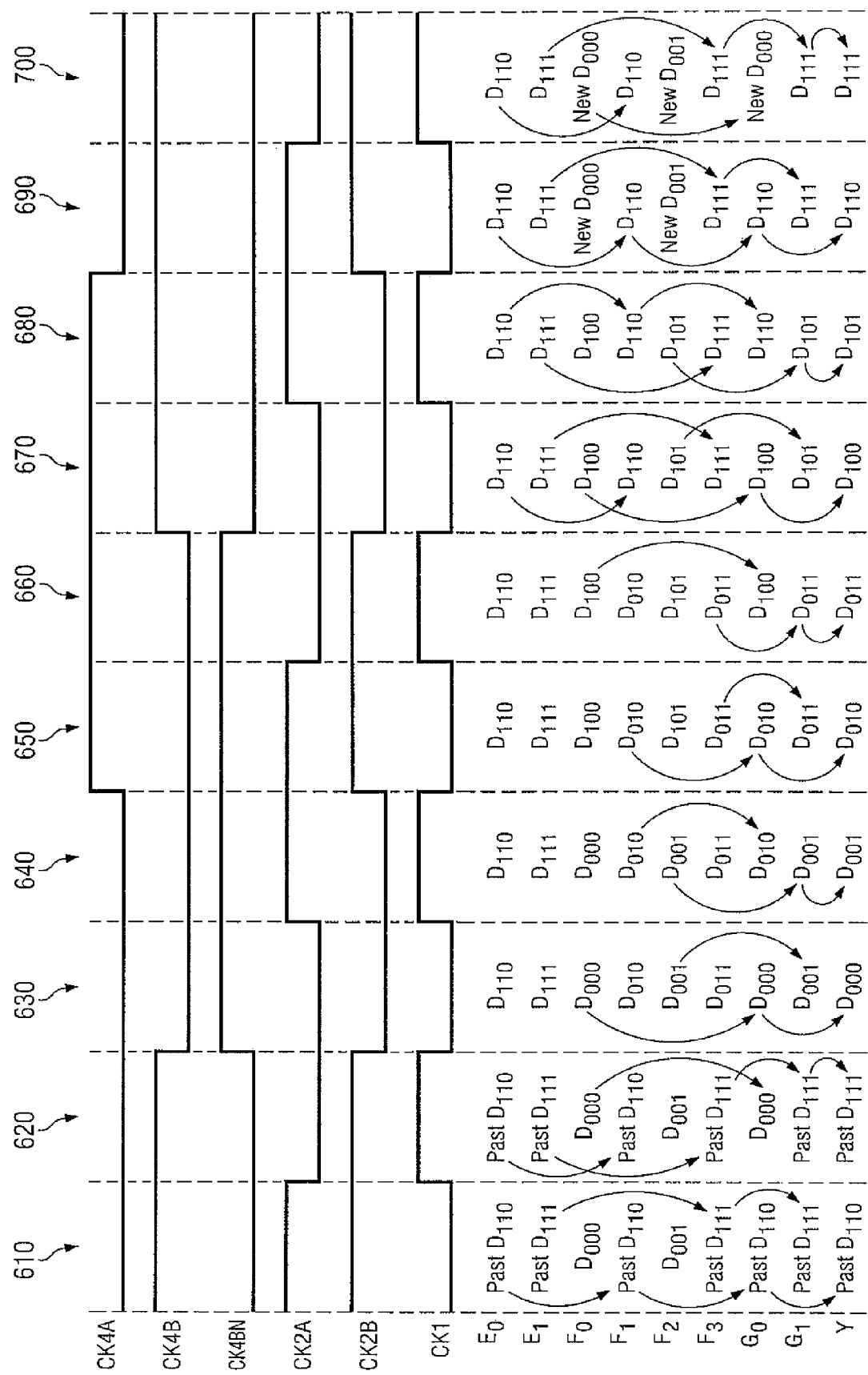
FIG. 6 is a data-flow diagram of a serializer for multiplexing eight inputs, in accordance with the embodiment illustrated in FIG. 4.

FIG. 6 is a data-flow diagram of serializer 400 for multiplexing eight inputs. The clock signals CK2A, CK2B, CK4A, CK4B, and CK4BN operate as described in reference to FIG. 4. In this example, the data inputs $D_{000}$, $D_{001}$, $D_{010}$, $D_{011}$, $D_{100}$, $D_{101}$, $D_{110}$ and $D_{111}$ are made available at the falling edge of clock signal CK4A. During time slot 610, clock signals CK4A, CK4BN, and CK1 are low, and clock signals CK4B, CK2A, and CK2B are high. As CK4A is low, multiplexer 440d selects input $D_{000}$ to output to node F0. Similarly, multiplexer 440f selects input $D_{001}$ to output to node F2. As CK4BN is low as well, input $D_{110}$ has no effect on the output of latch 450a, and node E0 remains equal to the value of the past $D_{110}$. Similarly, input $D_{111}$ has no effect on the output of latch 450b, and node E1 remains equal to the value of the past $D_{111}$. As CK4B is high, multiplexer 440e selects the past $D_{110}$ to output to F1, and as CK2A is high as well, multiplexer 440b outputs the past $D_{110}$ to G0. Similarly, multiplexer 440g outputs the past $D_{111}$ to $F_3$, and multiplexer 440c outputs the past $D_{111}$ to G1. Finally, as CK1 is low, multiplexer 440a selects the past $D_{110}$ to route to output Y.

During time slot 620, clock signals CK4A, CK2A, and CK4BN are low, and clock signals CK4B, CK2B, and CK1 are high. As CK2A is low, and CK4A has remained low as well, multiplexer 440b outputs input $D_{000}$ to G0. As CK4BN is low as well, input $D_{111}$ has no effect on the output of latch 450b, and node E1 remains equal to the value of the past $D_{111}$, as in time slot 610. As CK1 and CK2B are both high, multiplexer 440a selects the past $D_{111}$ to output to Y.

During time slot 630, clock signals CK4A, CK4B, CK2A, CK2B, and CK1 are low, while clock signal CK4BN is high. As CK1 is low, and both CK4A and CK2A have remained low as well, multiplexer 440a selects input $D_{000}$ to output to Y. As in the data-flow diagram of FIG. 3, the path of $D_{000}$ through the serializer is the critical path. As such, the path for $D_{000}$ affects how quickly serializer 100 can transmit the four data inputs. As CK4BN is high during time slot 630, the output of latch 450a is equal to its input $D_{110}$, and node E0 is set to the value of $D_{110}$. Similarly, the output of latch 450b is equal to its input $D_{111}$, and node E1 is set to the value of $D_{111}$.

The serializer operation during steps 640-700 is similar to that of the operation of the four-input serializer as reflected in steps 330-350 of FIG. 3; each of the remaining seven data bits propagate through the serializer in succession. Similar to the serializer operation reflected in FIG. 3, the latches' holding of the last two digits to be transmitted allows for the inputting of new data to the serializer without affecting the transmission of the last digit of the sequence.

As FIG. 6 illustrates, a serializer 400 can process eight data inputs using only two latches. The serializer 400 processes the data inputs using two clock signals—CK2A and CK2B—generated on both edges of clock signal CK1, and three clock signals—CK4A, CK4B, and CK4BN—generated on both edges of clock signal CK2B. By taking advantage of slower clock signal generation on both edges of clock signals CK1 and CK2B and using only two latches, serializer 400 may consumer less power than other eight-input serializers.

Although the present disclosure and its advantages have been described in detail, it should be understood that various changes, substitutions, and alterations can be made therein without departing from the spirit and scope of the disclosure as defined by the appended claims.

What is claimed is:

1. A high speed serializer for multiplexing $2^N$ data inputs, N being a positive integer, the serializer comprising:
   one less than $2^N$ multiplexing cells arranged in N stages, the stages numbered 1 through N, wherein the output of the $N^{th}$ stage is a serial transmission and the inputs of the $1^{st}$ stage are the $2^N$ data inputs;
   wherein each stage comprises half as many multiplexing cells as the preceding stage; and
   wherein each multiplexing cell comprises a multiplexer, the multiplexer comprising a pair of inputs and an output, and at most $2^{N-2}$ of the multiplexing cells in the first stage further comprise a latch, wherein the output of the latch is coupled to an input of the multiplexer.

2. A high speed serializer for multiplexing $2^N$ data inputs, N being a positive integer, the serializer comprising:
   one less than $2^N$ multiplexing cells arranged in N stages, the stages numbered 1 through N, wherein the output of the $N^{th}$ stage is a serial transmission and the inputs of the $1^{st}$ stage are the $2^N$ data inputs;
   wherein each stage comprises half as many multiplexing cells as the preceding stage;
   wherein each multiplexing cell comprises a multiplexer, the multiplexer comprising a pair of inputs and an output, and $2^{N-2}$ of the multiplexing cells in the first stage further comprise a latch, wherein the output of the latch is coupled to an input of the multiplexer;
   wherein the multiplexer in the $N^{th}$ stage is configured for receiving a clock signal and the multiplexers in each stage preceding the $N^{th}$ stage are configured for receiving one of two clock signals;
   wherein half of the multiplexers in each stage preceding the $N^{th}$ stage are configured for receiving the same one of two clock signals;
   wherein the clock signals received by the multiplexers in each stage preceding the $N^{th}$ stage operate at half the frequency of the clock signals received by the multiplexers in the subsequent stage; and
   wherein each latch is configured to receive a clock signal having the opposite state of the clock signal received by the multiplexer to which it is coupled.

3. The serializer of claim 2, wherein the two clock signals received by the multiplexers in each stage preceding the $N^{th}$ stage are skewed from each other by a half cycle of the clock signal received by the multiplexers of the subsequent stage.

4. The serializer of claim 3, wherein the multiplexing cells of the first stage are operable to receive the parallel data on the falling edge of the clock signal received by the multiplexers in the first stage that are not coupled to a latch.

5. The serializer of claim 4, wherein the falling edge of the clock signal received by the multiplexers in the first stage that are coupled to a latch follows the falling edge of the clock signal received by the multiplexers in the first stage that are not coupled to a latch.

6. The serializer of claim 2, further comprising a clock generator coupled to each stage of the serializer for supplying the clock signals to each stage.

7. The serializer of claim 6, wherein:
the clock generator comprises one less than N master-slave flip-flops;
each master-slave flip-flop is configured to receive a clock signal received by the multiplexers of a stage of the serializer to produce the clock signals received by the multiplexing cells of the preceding stage of the serializer.

8. The serializer of claim 1, wherein the latch is an active positive level latch.

9. A method for multiplexing $2^N$ data inputs, N being a positive integer, wherein the method comprises:
generating a serial transmission using one less than $2^N$ multiplexing cells arranged in N stages, the stages numbered 1 through N, wherein the output of the $N^{th}$ stage is the serial transmission and the inputs of the $1^{st}$ stage are the $2^N$ data inputs;
wherein each stage comprises half as many multiplexing cells as the preceding stage; and
wherein each multiplexing cell comprises a multiplexer, the multiplexer comprising a pair of inputs and an output, and at most $2^{N-2}$ of the multiplexing cells in the first stage further comprise a latch, wherein further the output of the latch is coupled to an input of the multiplexer.

10. A method for multiplexing $2^N$ data inputs, N being a positive integer, wherein the method comprises:
generating a serial transmission using one less than $2^N$ multiplexing cells arranged in N stages, the stages numbered 1 through N, wherein the output of the $N^{th}$ stage is the serial transmission and the inputs of the $1^{st}$ stage are the $2^N$ data inputs;
wherein each stage comprises half as many multiplexing cells as the preceding stage;
wherein each multiplexing cell comprises a multiplexer, the multiplexer comprising a pair of inputs and an output, and $2^{N-2}$ of the multiplexing cells in the first stage further comprise a latch, wherein further the output of the latch is coupled to an input of the multiplexer;
wherein the multiplexer in the $N^{th}$ stage is configured for receiving a clock signal and the multiplexers in each stage preceding the $N^{th}$ stage are configured for receiving one of two clock signals;
wherein half of the multiplexers in each stage preceding the $N^{th}$ stage are configured for receiving the same one of two clock signals;
wherein the clock signals received by the multiplexers in each stage preceding the $N^{th}$ stage operate at half the frequency of the clock signals received by the multiplexers in the subsequent stage; and
wherein each latch is configured to receive a clock signal having the opposite state of the clock signal received by the multiplexer to which it is coupled.

11. The method of claim 10, wherein the two clock signals received by the multiplexers in each stage preceding the $N^{th}$ stage are skewed from each other by a half cycle of the clock signal received by the multiplexers of the subsequent stage.

12. The method of claim 11, wherein the multiplexing cells of the first stage are operable to receive the parallel data on the falling edge of the clock signal received by the multiplexers in the first stage that are not coupled to a latch.

13. The method of claim 12, wherein the falling edge of the clock signal received by the multiplexers in the first stage that are coupled to a latch follows the falling edge of the clock signal received by the multiplexers in the first stage that are not coupled to a latch.

14. The method of claim 10, further comprising a clock generator coupled to each stage of the serializer for supplying the clock signals to each stage.

15. The method of claim 14, wherein:
the clock generator comprises one less than N master-slave flip-flops;
each master-slave flip-flop is configured to receive a clock signal received by the multiplexers of a stage of the serializer to produce the clock signals received by the multiplexing cells of the preceding stage of the serializer.

16. The method of claim 9, wherein the latch is an active positive level latch.

17. A high speed serializer for multiplexing $2^N$ data inputs, N being a positive integer, the serializer comprising:
a plurality of multiplexing cells arranged in N stages, the stages numbered 1 through N, wherein the output of the $N^{th}$ stage is a serial transmission and the inputs of the $1^{st}$ stage are the $2^N$ data inputs;
wherein each multiplexing cell comprises at least a multiplexer, the multiplexer comprising a pair of inputs and an output;
wherein the multiplexer in the $N^{th}$ stage is configured for receiving a clock signal and the multiplexers in each stage preceding the $N^{th}$ stage are configured for receiving one of two clock signals;
wherein half of the multiplexers in each stage preceding the $N^{th}$ stage are configured for receiving the same one of two clock signals;
wherein the clock signals received by the multiplexers in each stage preceding the $N^{th}$ stage operate at half the frequency of the clock signals received by the multiplexers in the subsequent stage; and
wherein the two clock signals received by the multiplexers in each stage preceding the $N^{th}$ stage are skewed from each other by a half cycle of the clock signal of the subsequent stage.

18. A method for multiplexing $2^N$ data inputs, N being a positive integer, wherein the method comprises:
generating a serial transmission using a plurality of multiplexing cells arranged in N stages, the stages numbered 1 through N, wherein the output of the $N^{th}$ stage is serial transmission and the inputs of the $1^{st}$ stage are the $2^N$ data inputs,
wherein each multiplexing cell comprises at least a multiplexer, the multiplexer comprising a pair of inputs and an output,
wherein the multiplexer in the $N^{th}$ stage is configured for receiving a clock signal and the multiplexers in each stage preceding the $N^{th}$ stage are configured for receiving one of two clock signals,
wherein half of the multiplexers in each stage preceding the $N^{th}$ stage are configured for receiving the same one of two clock signals,
wherein the clock signals received by the multiplexers in each stage preceding the $N^{th}$ stage operate at half the frequency of the clock signals received by the multiplexers in the subsequent stage, and
wherein the two clock signals received by the multiplexers in each stage preceding the $N^{th}$ stage are skewed from each other by a half cycle of the clock signal of the subsequent stage.

19. A high speed serializer for multiplexing 4 data inputs, the serializer comprising:
a first multiplexer comprising a pair of inputs and an output;

a latch comprising an input and an output, wherein the output of the latch is coupled to an input of the first multiplexer;

a second multiplexer comprising a pair of inputs and an output; and a third multiplexer comprising a first input, a second input, and an output, wherein:
the output of the first multiplexer is coupled directly to the first input of the third multiplexer;
the output of the second multiplexer is coupled directly to the second input of the third multiplexer; and
the output of the third multiplexer is a serial transmission.

20. A high speed serializer for multiplexing 4 data inputs, the serializer comprising:

a first multiplexer comprising a pair of inputs and an output;

a latch comprising an input and an output, wherein the output of the latch is coupled to an input of the first multiplexer;

a second multiplexer comprising a pair of inputs and an output; and a third multiplexer comprising a first input, a second input, and an output, wherein:
the output of the first multiplexer is coupled to the first input of the third multiplexer;
the output of the second multiplexer is coupled to the second input of the third multiplexer;
the output of the third multiplexer is a serial transmission;

wherein the first multiplexer is configured for receiving a first clock signal, the second multiplexer is configured for receiving a second clock signal, the third multiplexer is configured for receiving a third clock signal, and the latch is configured for receiving a fourth clock signal, wherein:
the first and second clock signals operate at half the frequency of the third clock signal; and
the fourth clock signal has the opposite state of the first clock signal.

21. The serializer of claim 20, wherein the first and second clock signals are skewed from each other by a half cycle of the third clock signal.

22. The serializer of claim 21, wherein the first multiplexer, the second multiplexer, and the latch are operable to receive parallel data on the falling edge of the second clock signal.

23. The serializer of claim 22, wherein the falling edge of the first clock signal follows the falling edge of the second clock signal.

24. The serializer of claim 23, further comprising a clock generator for supplying the clock signals to the first multiplexer, the second multiplexer, the third multiplexer, and the latch.

25. The serializer of claim 24, wherein the clock generator comprises a master-slave flip-flop, wherein the master-slave flip-flop is configured to receive the third clock signal to produce the first, second, and fourth clock signals.

26. The serializer of claim 19, wherein the latch is an active positive level latch.

27. A method for multiplexing 4 data inputs, wherein the method comprises:
generating a serial transmission using:
a first multiplexer comprising a pair of inputs and an output;

a latch comprising an input and an output, wherein the output of the latch is coupled to an input of the first multiplexer;

a second multiplexer comprising a pair of inputs and an output; and a third multiplexer comprising a first input, a second input, and an output, wherein:
the output of the first multiplexer is directly coupled to the first input of the third multiplexer;
the output of the second multiplexer is directly coupled to the second input of the third multiplexer; and
the output of the third multiplexer is the serial transmission.

28. A method for multiplexing 4 data inputs, wherein the method comprises:
generating a serial transmission using:
a first multiplexer comprising a pair of inputs and an output,
a latch comprising an input and an output, wherein the output of the latch is coupled to an input of the first multiplexer;
a second multiplexer comprising a pair of inputs and an output; and
a third multiplexer comprising a first input, a second input, and an output, wherein:
the output of the first multiplexer is coupled to the first input of the third multiplexer;
the output of the second multiplexer is coupled to the second input of the third multiplexer; and
the output of the third multiplexer is the serial transmission;

wherein the first multiplexer is configured for receiving a first clock signal, the second multiplexer is configured for receiving a second clock signal, the third multiplexer is configured for receiving a third clock signal, and the latch is configured for receiving a fourth clock signal, wherein:
the first and second clock signals operate at half the frequency of the third clock signal; and
the fourth clock signal has the opposite state of the first clock signal.

29. The method of claim 28, wherein the first and second clock signals are skewed from each other by a half cycle of the third clock signal.

30. The method of claim 29, wherein the first multiplexer, the second multiplexer, and the latch are operable to receive parallel data on the falling edge of the second clock signal.

31. The method of claim 30, wherein the falling edge of the first clock signal follows the falling edge of the second clock signal.

32. The method of claim 31, further comprising a clock generator for supplying the clock signals to the first multiplexer, the second multiplexer, the third multiplexer, and the latch.

33. The method of claim 32, wherein the clock generator comprises a master-slave flip-flop, wherein the master-slave flip-flop is configured to receive the third clock signal to produce the first, second, and fourth clock signals.

34. The method of claim 27, wherein the latch is an active positive level latch.

* * * * *